(12) United States Patent
Sakai

(10) Patent No.: US 8,355,229 B2
(45) Date of Patent: Jan. 15, 2013

(54) SEMICONDUCTOR DEVICE WITH AN INDUCTOR

(75) Inventor: Shingo Sakai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 73 days.

(21) Appl. No.: 12/826,080

(22) Filed: Jun. 29, 2010

(65) Prior Publication Data

US 2011/0002076 A1  Jan. 6, 2011

(30) Foreign Application Priority Data

Jul. 2, 2009  (JP) .................................. 2009-157656

(51) Int. Cl.
| | |
|---|---|
| H02H 9/00 | (2006.01) |
| H01C 7/12 | (2006.01) |
| H02H 1/00 | (2006.01) |
| H02H 1/04 | (2006.01) |
| H02H 3/22 | (2006.01) |
| H02H 9/06 | (2006.01) |

(52) U.S. Cl. ......................................... 361/56; 361/118
(58) Field of Classification Search ..................... 361/56
See application file for complete search history.

(56) References Cited

U.S. PATENT DOCUMENTS

2007/0070569 A1* 3/2007 Chida et al. .................... 361/118
2011/0002076 A1* 1/2011 Sakai ............................ 361/212

FOREIGN PATENT DOCUMENTS

JP   2007-103477 A   4/2007

* cited by examiner

*Primary Examiner* — Dharti Patel
(74) *Attorney, Agent, or Firm* — Sughrue Mion, PLLC

(57) ABSTRACT

A semiconductor device including an electrostatic discharge element that protects the semiconductor device from electrostatic destruction is provided. The semiconductor device includes a first circuit, a second circuit, a connection node connecting the first node to the second node, and a first inductor connected between the connection node and a first power supply. The first inductor and the electrostatic discharge element are formed so that they vertically overlap each other.

10 Claims, 12 Drawing Sheets

SEMICONDUCTOR DEVICE WITH AN INDUCTOR

INCORPORATION BY REFERENCE

This application is based upon and claims the benefit of priority from Japanese patent application No. 2009-157656, filed on Jul. 2, 2009, the disclosure of which is incorporated herein in its entirety by reference.

BACKGROUND

1. Field of the Invention

The present invention relates to a semiconductor device with an inductor, in particular to a layout configuration of an inductor.

2. Description of Related Art

In recent years, as the operation of semiconductor devices has become faster, the use of inductors for the purpose of widening the frequency band and/or of matching the impedance has become more common. In external interface buffers, in particular, the improvement in the characteristics by using inductors has become more important.

An example of a configuration of a related semiconductor device with an inductor is explained with reference to FIGS. 15 to 17. FIGS. 15 to 17 show an external output interface buffer as an example. FIG. 15 is a plane view of a layout; FIG. 16 is a cross section along the line XVI-XVI in FIG. 15; and FIG. 17 a circuit diagram corresponding to the layout shown in FIGS. 15 and 16.

In FIG. 17, the circuit includes an inductor 1, an ESD (Electro-Static Discharge) element 2, an output buffer 3, a terminator 4, an external output terminal 5, a first power supply 13, and a connection node 15. The connection node 15 electrically connects the output terminal 5 to the output buffer 3. The inductor 1 is connected between the connection node 15 and the first power supply 13. In this embodiment, the terminator 4 is also connected in series with the inductor 1 between the connection node 15 and the first power supply 13. The ESD element 2 is connected between the connection node 15 and a GND (ground: second power supply). Note that the first power supply 13 supplies a first voltage. Further, the GND, which is the second power supply, supplies a second voltage.

That is, one terminal of the inductor 1 is electrically connected to the terminator 4. The other terminal of the inductor 1 is electrically connected to the ESD element 2, the output buffer 3, and the external output terminal 5. The other terminal of the terminator 4 is electrically connected to the first power supply 13. The other terminal of the ESD element 2 is electrically connected to the GND.

In FIGS. 15 and 16, an inductor 1, an ESD element 2, an output buffer 3, a terminator 4, an external output terminal 5, a second-layer via 6, a second-layer line 7, a first-layer via 8, a first-layer line 9, a contact 10, a wiring layer 11, and a semiconductor substrate 12 are shown. The inductor 1 and the output terminal 5 are formed in the wiring layer 11. The ESD element 2, the output buffer 3, and the terminator 4 are formed in the semiconductor substrate 12. The inductor 1 is formed by a line in the uppermost layer. One terminal of the inductor 1 is connected to the external output terminal 5, which is also formed by a line in the uppermost layer, through the second-layer via 6 and the second-layer line 7. Further, the one terminal of the inductor 1 is also connected to the ESD element 2 and the output buffer 3 through the second-layer via 6, the second-layer line 7, the first-layer via 8, the first-layer line 9, and the contact 10. The other terminal of the inductor 1 is connected to the terminator 4 through the second-layer via 6, the second-layer line 7, the first-layer via 8, the first-layer line 9, and the contact 10.

As disclosed in Japanese Unexamined Patent Application Publication No. 2007-103477, the characteristic of an inductor deteriorates due to the parasitic capacitance generated in its own. Therefore, an inductor is formed so that no wiring layer or element is disposed below the inductor in order to reduce the parasitic capacitance as much as possible. Further, an inductor is often formed so that no element is disposed below the inductor in order to reduce the effect that is exerted on other elements by noise caused by the inductor as well as the effect that is exerted on the inductor by noise caused by other elements as much as possible. That is, an inductor is formed such that no element other than the line used to connect the inductor is disposed below the inductor.

SUMMARY

As described above, a dedicated area is often prepared for an inductor to ensure excellent characteristics of the inductor. Further, if the resistance of the line forming an inductor is high, it could cause deterioration of its characteristics. Therefore, the line needs to have a large width to some extent, and thus inevitably increasing the area for the inductor to some extent. In this way, the above-described configuration requires a large chip area to form an inductor.

Further, since an inductor is formed in a dedicated area, it is located away from other elements to which the inductor needs to be electrically connected. Therefore, the parasitic capacitance and the parasitic resistance of the connection line between the inductor and the other elements become larger, and thus deteriorating the characteristic of the overall circuit. A first exemplary aspect of the present invention is a semiconductor device including an electrostatic discharge element that protects the semiconductor device from electrostatic destruction, the semiconductor further including: a first circuit; a second circuit; a connection node connecting the first node to the second node; and a first inductor connected between the connection node and a first power supply, wherein the first inductor and the electrostatic discharge element are formed so that they vertically overlap each other. In this way, since there is no need to prepare a dedicated area for an inductor, it is possible to suppress the increase in the layout size of the circuit including an inductor, and thereby to use the chip area effectively.

In accordance with an exemplary aspect of the present invention, there is no need to prepare a dedicated area for an inductor, and therefore the chip area can be effectively used.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention are explained hereinafter with reference to the drawings. Note that the same components are denoted with the same signs throughout the drawings, and duplicated explanation is omitted as appropriate.

First Exemplary Embodiment

Figure 1:
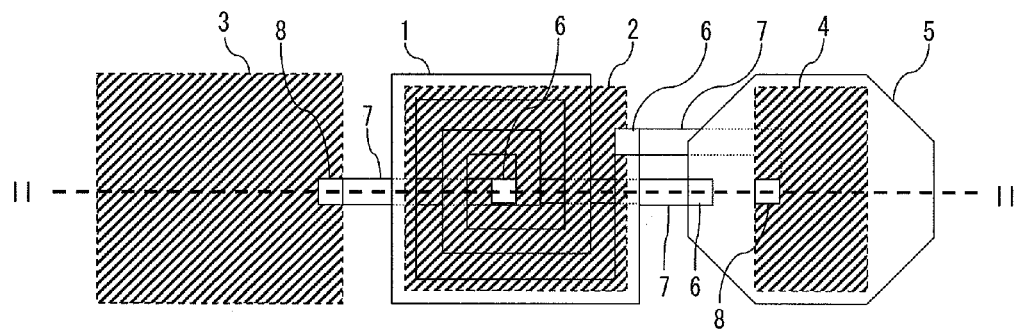
FIG. 1 is a layout plane view schematically showing a semiconductor device in accordance a first exemplary embodiment of the present invention.
Figure 2:
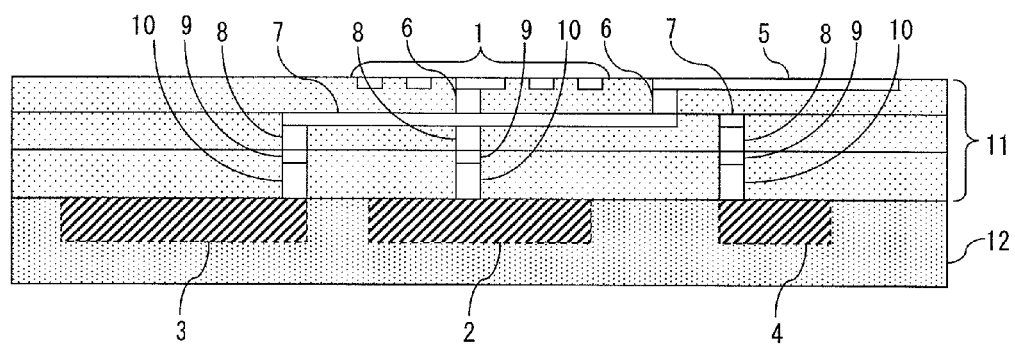
FIG. 2 is a cross section along the line II-II of FIG. 1.
Figure 17:
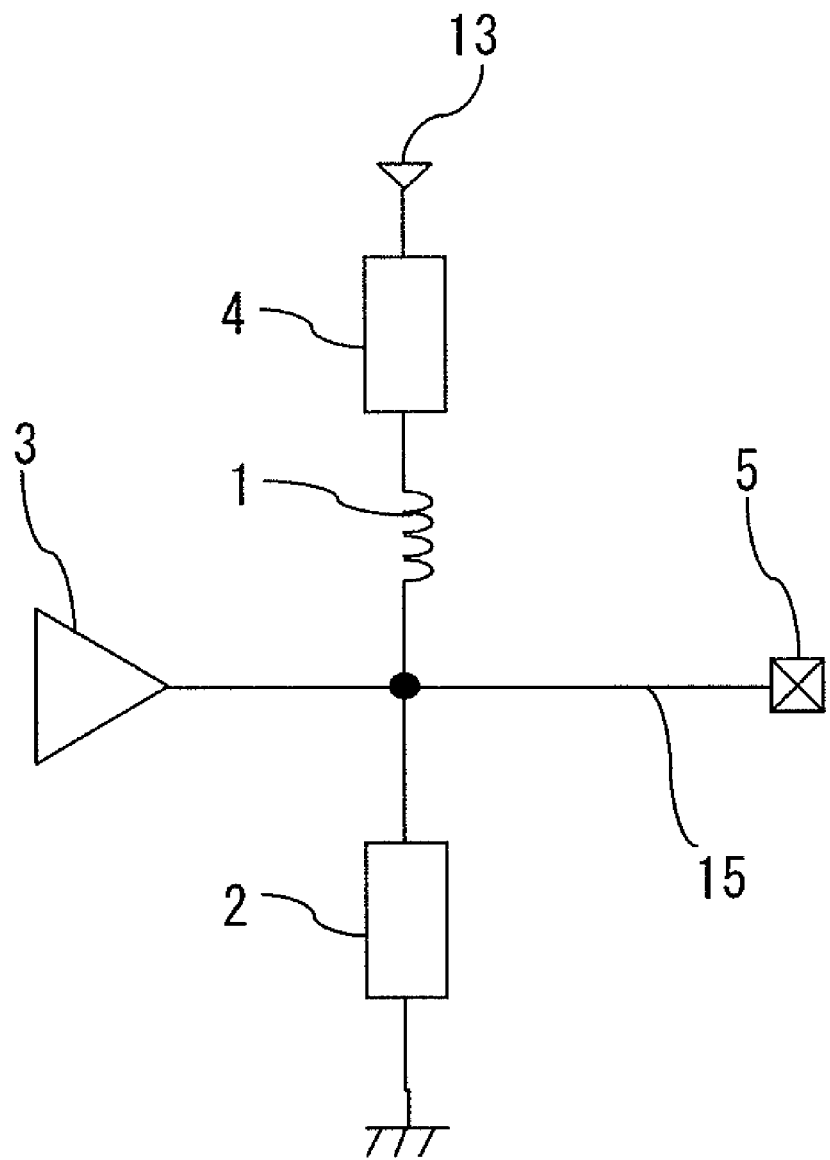
FIG. 17 is a circuit configuration diagram of a related semiconductor device and a semiconductor device in accordance with first exemplary embodiment of the present invention.

FIGS. 1 and 2 show a semiconductor device in accordance with a first exemplary embodiment of the present invention. FIGS. 1 and 2 show an external output interface buffer as an example. FIG. 1 is a plane view of a layout, and FIG. 2 is a cross section along the line II-II of FIG. 1. A circuit diagram corresponding to the layout of FIGS. 1 and 2 is the above-described circuit diagram shown in FIG. 17. Therefore, its explanation is omitted here.

In FIGS. 1 and 2, an inductor 1, an ESD element 2, an output buffer 3 that is the first circuit, a terminator 4, an output terminal 5 that is the second circuit, a second-layer via 6, a second-layer line 7, a first-layer via 8, a first layer line 9, a contact 10, a wiring layer 11, and a semiconductor substrate 12 are shown. The inductor 1 and the output terminal 5 are formed in the wiring layer 11. The ESD element 2, the output buffer 3, and the terminator 4 are formed in the semiconductor substrate 12.

The inductor 1 is formed by a line in the uppermost layer. One terminal of the inductor 1 is electrically connected to the output terminal 5, which is also formed by a line in the uppermost layer, through the second-layer via 6 and the second-layer line 7. Further, the one terminal of the inductor 1 is electrically connected to the ESD element 2 and the output buffer 3 through the second-layer via 6, the second-layer line 7, the first-layer via 8, the first-layer line 9, and the contact 10. The other terminal of the inductor 1 is electrically connected to the terminator 4 through the second-layer via 6, the second-layer line 7, the first-layer via 8, the first-layer line 9, and the contact 10.

Figure 15:
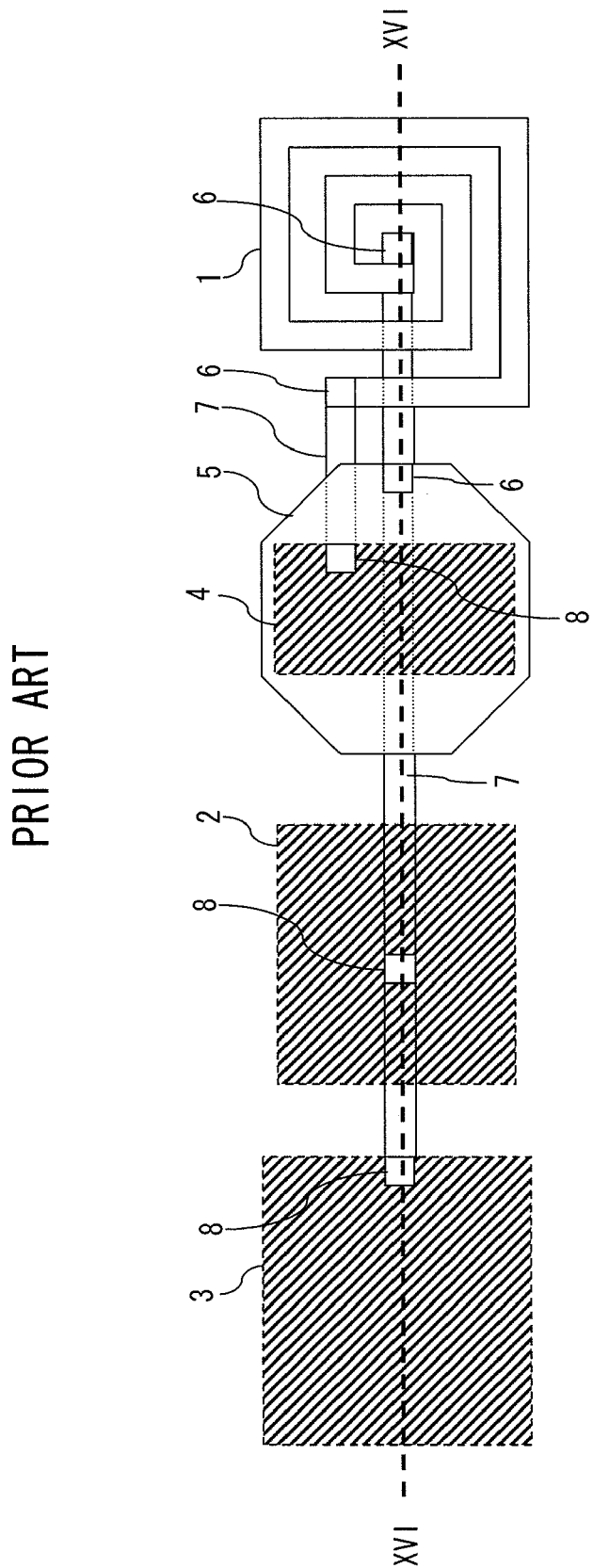
FIG. 15 is a layout plane view schematically showing a related semiconductor device.
Figure 16:
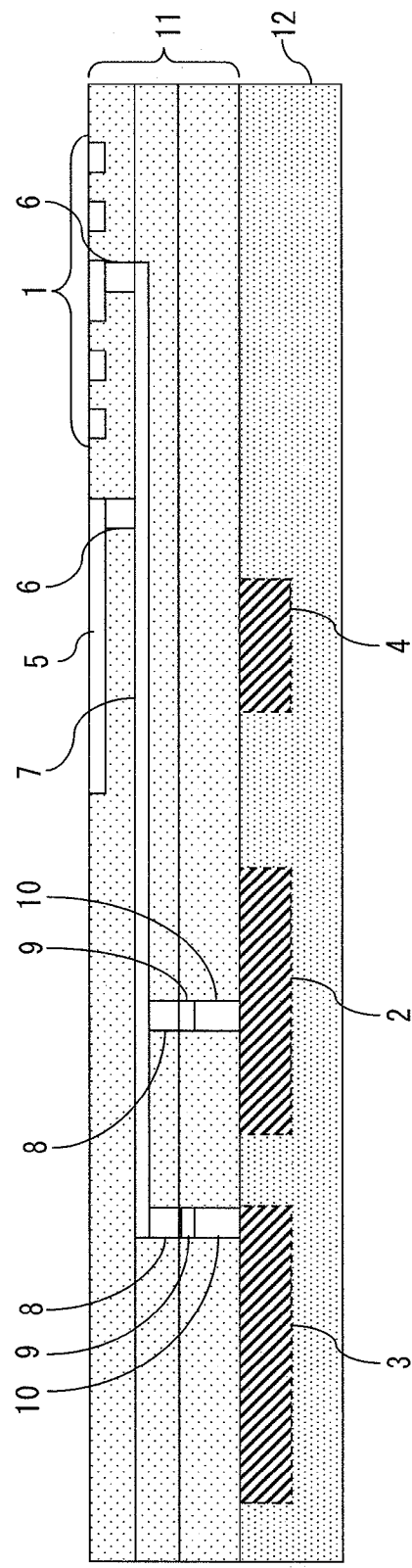
FIG. 16 is a cross section along the line XVI-XVI of FIG. 15.

In FIGS. 1 and 2, the inductor 1 is formed above the ESD element 2 such that the inductor 1 and the ESD element 2 vertically overlap each other. In the above-described configuration, there is no need to prepare a dedicated area for the inductor 1 in contrast to the configuration shown in FIGS. 15 and 16. Therefore, the above-described configuration can suppress the increase in the layout size of the circuit including the inductor 1, and thus enabling the chip area to be effectively used.

Further, the distance between the inductor 1 and the ESD element 2 can be minimized. Therefore, in the case of a circuit configuration in which the inductor 1 is connected to the ESD element 2 as shown in FIGS. 1 and 2, the length of the connection line can be minimized. Accordingly, it is possible to minimize the parasitic capacitance and the parasitic resistance of the connection line, and thereby to minimize the characteristic deterioration of the circuit due to the parasitic capacitance and the parasitic resistance of the connection line. At the same time, the distance between the inductor 1 and the output buffer 3 or the terminator 4, which is disposed in the vicinity of the ESD element 2, can also be shortened in comparison to that in FIGS. 15 and 16. Therefore, the characteristic deterioration of the circuit due to the increase of the parasitic capacitance and the parasitic resistance of the connection line between the inductor 1 and the output buffer 3 or the terminator 4 can be suppressed.

Note that the ESD element 2, which is formed so as to be disposed below the inductor 1, does not usually operate except for the charging/discharging at the time of ESD application. Therefore, in an operating state where the output buffer 3 is outputting a signal, the effect caused by the noise from the inductor 1 on the ESD element 2 is negligible. Further, in the operating state, since the ESD element 2 is not operating, no noise is caused by the ESD element 2 and therefore no characteristic variation occurs in the inductor 1.

Second Exemplary Embodiment

Figure 3:
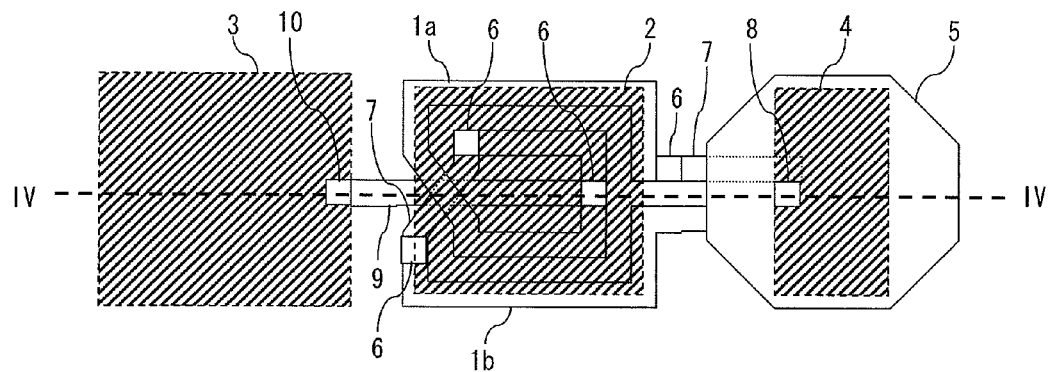
FIG. 3 is a layout plane view schematically showing a semiconductor device in accordance a second exemplary embodiment of the present invention.
Figure 4:
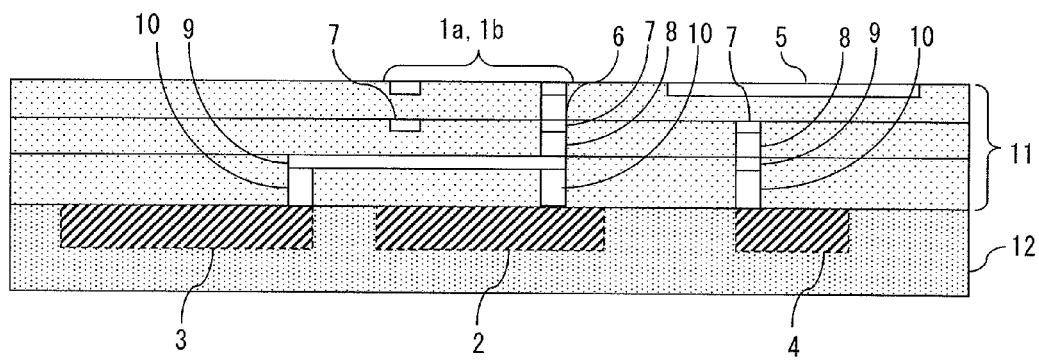
FIG. 4 is a cross section along the line IV-IV of FIG. 3.
Figure 5:
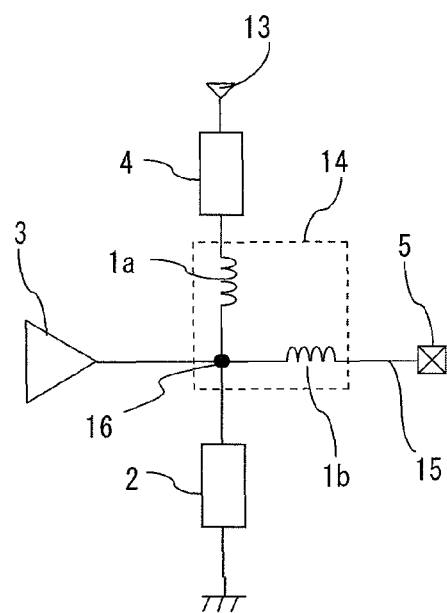
FIG. 5 is a circuit configuration diagram of a semiconductor device in accordance a second exemplary embodiment of the present invention.

FIGS. 3 to 5 show a semiconductor device in accordance with a second exemplary embodiment of the present invention. FIGS. 3 to 5 show an external output interface buffer as an example. FIG. 3 is a plane view of a layout, and FIG. 4 is a cross section along the line IV-IV of FIG. 3. Further, FIG. 5 is a circuit diagram corresponding to the layout of FIGS. 3 and 4.

In FIG. 5, a first inductor 1a, a second inductor 1b, an ESD element 2, an output buffer 3, a terminator 4, an output terminal 5, a first power supply 13, coupled inductors 14, a connection node 15, and a connection point 16 are shown. One terminal of the first inductor 1a is electrically connected to the terminator 4. The other terminal of the first inductor 1a is electrically connected to the second inductor 1b, the ESD element 2, and the output buffer 3. The other terminal of the second inductor 1b is electrically connected to the output terminal 5. The other terminal of the terminator 4 is electrically connected to the first power supply 13. The other terminal of the ESD element 2 is electrically connected to a GND (second power supply). The first inductor 1a and the second inductor 1b form coupled inductors 14 having a mutual inductance and a coupling capacitance with each other. That is, the semiconductor device in accordance with this second exemplary embodiment has a roughly similar configuration to the semiconductor device in accordance with the first exemplary embodiment except that the second inductor 1b is connected between the connection point 16 between the connection node 15 and the first inductor 1a and the output terminal 5 in the connection node 15.

In FIGS. 3 and 4, a first inductor 1a, a second inductor 1b, an ESD element 2, an output buffer 3, a terminator 4, an output terminal 5, a second-layer via 6, a second-layer line 7, a first-layer via 8, a first layer line 9, a contact 10, a wiring layer 11, and a semiconductor substrate 12 are shown. The first inductor 1a and the second inductor 1b form coupled inductors 14 shown in FIG. 5. The first inductor 1a, the second inductor 1b, and the output terminal 5 are formed in the wiring layer 11. The ESD element 2, the output buffer 3, and the terminator 4 are formed in the semiconductor substrate 12.

The first inductor 1a is formed by a line in the uppermost layer. One terminal of the first inductor 1a is electrically connected to the terminator 4 through the second-layer via 6, the second-layer line 7, the first-layer via 8, the first-layer line 9, and the contact 10. The other terminal of the first inductor 1a is electrically connected to the second inductor 1b through a line in the same layer. Further, the other terminal of the first inductor 1a is electrically connected to the ESD element 2 and the output buffer 3 through the second-layer via 6, the second-layer line 7, the first-layer via 8, the first-layer line 9, and the contact 10.

The second inductor 1b is formed by a line in the uppermost layer, the second-layer via 6, and the second-layer line 7. The other terminal of the second inductor 1b is electrically connected to the output terminal 5 formed by a line in the uppermost layer through a line in the uppermost layer. The other terminal of the second inductor 1b is electrically connected to the first inductor 1a through a line in the uppermost layer.

In FIGS. 3 and 4, the first inductor 1a and the second inductor 1b are formed above the ESD element 2 such that the first inductor 1a and second inductor 1b are disposed over the ESD element 2. In this second exemplary embodiment, the effect of suppressing the increase of the layout size that is achieved by the fact that the first inductor 1a and second inductor 1b are formed above the ESD element 2 such that they are disposed over the ESD element 2, as well as the effect of suppressing the characteristic deterioration of the circuit that is achieved by suppressing the increase of the parasitic capacitance and the parasitic resistance of the connection line with other elements are similar to those of the first exemplary embodiment. In the semiconductor device in accordance with the second exemplary embodiment, in particular, instead of a single inductor, coupled inductors 14, which are formed by two inductors 1a and 1b as shown in FIG. 5, are used as a constituent element.

Third Exemplary Embodiment

Figure 6:
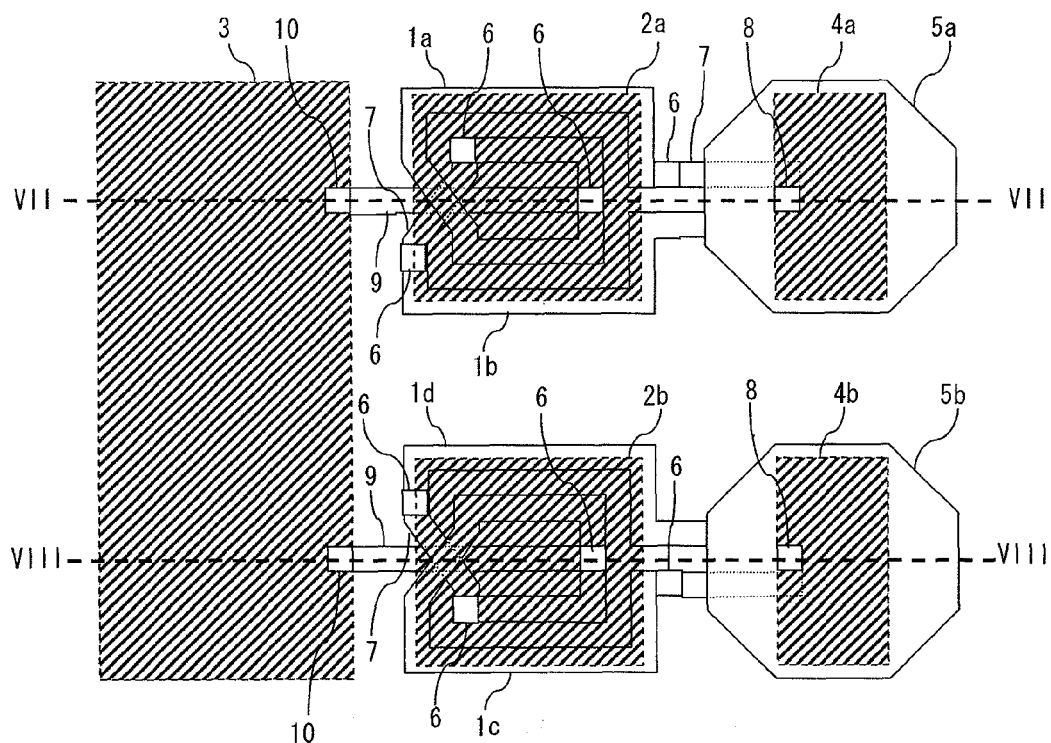
FIG. 6 is a layout plane view schematically showing a semiconductor device in accordance a third exemplary embodiment of the present invention.
Figure 7:
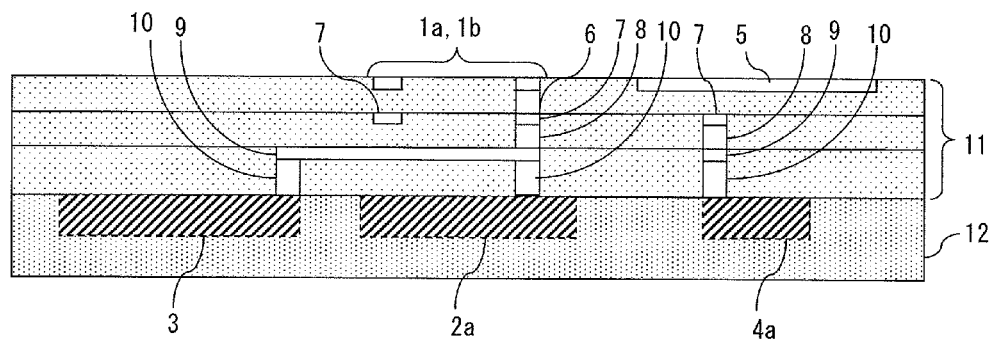
FIG. 7 is a cross section along the line VII-VII of FIG. 6.
Figure 8:
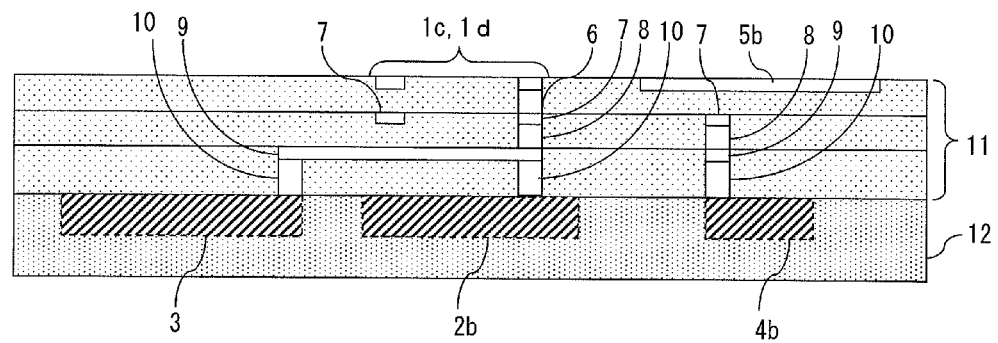
FIG. 8 is a cross section along the line VIII-VIII of FIG. 6.
Figure 9:
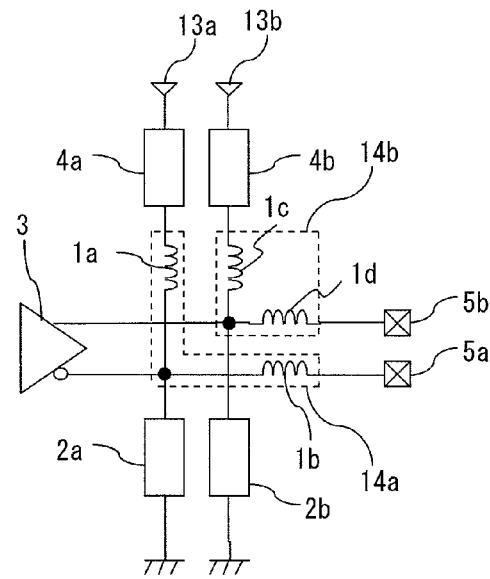
FIG. 9 is a circuit configuration diagram of a semiconductor device in accordance a third exemplary embodiment of the present invention.

FIGS. 6 to 9 show a semiconductor device in accordance with a third exemplary embodiment of the present invention. FIGS. 6 to 9 show differential external output interface buffers as an example. FIG. 6 is a plane view of a layout, and FIG. 7 is a cross section along the line VII-VII of FIG. 6. Further, FIG. 8 is a cross section along the line VIII-VIII of FIG. 6, and FIG. 9 is a circuit diagram corresponding to the layout of FIGS. 6 to 8.

In FIG. 9, a first inductor 1a, a second inductor 1b, a third inductor 1c, a fourth inductor 1d, a first ESD element 2a, a second ESD element 2b, an output buffer 3, a first terminator 4a, a second terminator 4b, a first external output terminal 5a, a second external output terminal 5b, first power supplies 13a and 13b, first coupled inductors 14a, second coupled inductors 14b are shown. Note that the first power supplies 13a and 13b are used to supply a first voltage, and may be mutually independent lines or mutually connected lines. Further, a GND, which is a second power supply, is used to supply a second voltage, may also be mutually independent lines or mutually connected lines.

One terminal of the first inductor 1a is electrically connected to the first terminator 4a. The other terminal of the first inductor 1a is electrically connected to the second inductor 1b, the first ESD element 2a, and the negative-side output terminal of the output buffer 3. The other terminal of the second inductor 1b is electrically connected to the output terminal 5a. The other terminal of the first terminator 4a is electrically connected to the first power supply 13a. The other terminal of the first ESD element 2a is electrically connected to a GND. The first inductor 1a and the second inductor 1b form first coupled inductors 14a having a mutual inductance and a coupling capacitance with each other.

One terminal of the third inductor 1c is electrically connected to the second terminator 4b. The other terminal of the third inductor 1c is electrically connected to the fourth inductor 1d, the second ESD element 2b, and the positive-side output terminal of the output buffer 3. The other terminal of the fourth inductor 1d is electrically connected to the output terminal 5b. The other terminal of the second terminator 4b is electrically connected to the first power supply 13b. The other terminal of the second ESD element 2b is electrically connected to a GND. The third inductor 1c and the fourth inductor 1d form coupled inductors 14b having a mutual inductance and a coupling capacitance with each other.

In FIGS. 6 to 9, a first inductor 1a, a second inductor 1b, a third inductor 1c, a fourth inductor 1d, a first ESD element 2a, a second ESD element 2b, an output buffer 3, a first terminator 4a, a second terminator 4b, a first output terminal 5a, a second output terminal 5b, a second-layer via 6, a second-layer line 7, a first-layer via 8, a first-layer line 9, a contact 10, a wiring layer 11, and a semiconductor substrate 12 are shown. The first inductor 1a and the second inductor 1b form first coupled inductors 14a shown in FIG. 9. The third inductor 1c and the fourth inductor 1d form second coupled inductors 14b shown in FIG. 9. The inductors 1a, 1b, 1c and 1d, and the output terminals 5a and 5b are formed in the wiring layer 11. The ESD elements 2a and 2b, the output buffer 3, the terminators 4a and 4b are formed in the semiconductor substrate 12.

The first inductor 1a is formed by a line in the uppermost layer. One terminal of the first inductor 1a is electrically connected to the first terminator 4a through the second-layer via 6, the second-layer line 7, the first-layer via 8, the first-layer line 9, and the contact 10. The other terminal of the first inductor 1a is electrically connected to the second inductor 1b through a line in the same layer. Further, the other terminal of the first inductor 1a is electrically connected to the first ESD element 2a and the output buffer 3 through the second-layer via 6, the second-layer line 7, the first-layer via 8, the first-layer line 9, and the contact 10.

The second inductor 1b is formed by a line in the uppermost layer, the second-layer via 6, and the second-layer line 7. The other terminal of the second inductor 1b is electrically connected to the first output terminal 5a formed by a line in the uppermost layer through a line in the uppermost layer. The other terminal of the second inductor 1b is electrically connected to the first inductor 1a through a line in the uppermost layer.

The third inductor 1c is formed by a line in the uppermost layer. One terminal of the third inductor 1c is electrically connected to the second terminator 4b through the second-layer via 6, the second-layer line 7, the first-layer via 8, the first-layer line 9, and the contact 10. The other terminal of the third inductor 1c is electrically connected to the fourth inductor 1d through a line in the same layer. Further, the other terminal of the third inductor 1c is electrically connected to the second ESD element 2b and the output buffer 3 through the second-layer via 6, the second-layer line 7, the first-layer via 8, the first-layer line 9, and the contact 10.

The fourth inductor 1d is formed by a line in the uppermost layer, the second-layer via 6, and the second-layer line 7. The other terminal of the fourth inductor 1d is electrically connected to the second output terminal 5b formed by a line in the uppermost layer through a line in the uppermost layer. The other terminal of the fourth inductor 1d is electrically connected to the third inductor 1c through a line in the uppermost layer.

In FIGS. 6 to 9, the first inductor 1a and the second inductor 1b are formed above the first ESD element 2a such that the first inductor 1a and second inductor 1b are disposed over the first ESD element 2a. The third inductor 1c and the fourth inductor 1d are formed above the second ESD element 2b such that the third inductor 1c and fourth inductor 1d are disposed over the second ESD element 2b.

In this third exemplary embodiment, the effect of suppressing the increase of the layout size that is achieved by the fact that the first and second inductor 1a and 1b are formed above the first ESD element 2a and the third and fourth inductor 1c and 1d are formed above the second ESD element 2b such that they are disposed over the corresponding ESD elements, as well as the effect of suppressing the characteristic deterioration of the circuit that is achieved by suppressing the increase of the parasitic capacitance and the parasitic resistance of the connection line with other elements are similar to those of the first exemplary embodiment. In the semiconductor device in accordance with the third exemplary embodiment, in particular, instead of a single inductor, the first coupled inductors 14a and second coupled inductors 14b, each of which are formed by two inductors for the differential buffer as shown in FIG. 9, are used as a constituent element.

As described previously, inductors are often formed such that they are not disposed over lines or other elements located below in order to reduce the characteristic deterioration due to the increase of the parasitic capacitance. However, in the above-described configuration, depending on conditions such as required characteristics for the inductor and the configuration of the layout, it is possible to reduce the characteristic deterioration even when lines and/or other elements are formed below the inductor.

Figure 10:
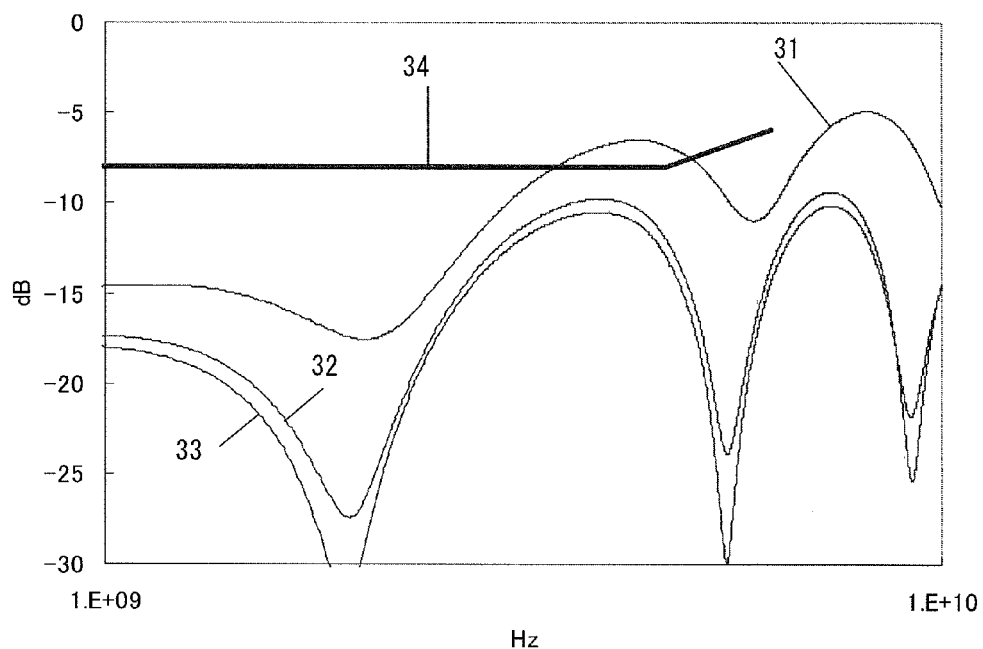
FIG. 10 shows a simulation result of a differential return loss.

FIG. 10 shows a simulation result verifying differential return losses, which are one of characteristics of interface buffers, in differential external output interface buffers having the same circuit configuration as that shown in FIG. 9. In FIG. 10, a plot 31 represents a simulation result in the case where the coupled inductors are removed in the circuit configuration shown in FIG. 9; a plot 32 represents a simulation result in the case where the coupled inductors are included and formed above the ESD element so that they overlap each other in the circuit configuration shown in FIG. 9; a plot 33 represents a simulation result in the case where the coupled inductors are included and formed such that no element or line is disposed below the coupled inductors in the circuit configuration shown in FIG. 9; and a plot 34 represents a standard of differential return losses at 6.25 Gps specified in CEI-6G-SR of OIF (The Optical Internetworking Forum).

In FIG. 10, the plot 31 cannot meet the standard 34. The plots 32 and 33 meet the standard 34, thus verifying the effects of impedance matching by the coupled inductors. Further, the difference between the plots 32 and 33 is smaller than 1 dB at the peak value around 4 GHz in the specified range. From these results, it is obvious that in the configurations adopted in the plots 31 and 32, the characteristic deterioration of coupled inductors can be reduced even when the coupled inductors are formed above an ESD element such that they overlap each other.

Although a semiconductor device in accordance with an exemplary aspect of the present invention is explained with an output buffer of an external interface in the above-described exemplary embodiments, the present invention is not limited to output buffers of external interfaces and various modifications and corrections can be made by those skilled in the art without departing from the scope of the present invention.

For example, the present invention is applicable to internal circuits as well as external interfaces, and to input buffers, bidirectional buffers, and circuits having other functions as well as output buffers. Further, the element that is disposed near the inductor on the layout is not limited to output buffers, terminators, and output terminals. That is, the present invention is also applicable to a semiconductor device in accordance a following fourth exemplary embodiment.

Fourth Exemplary Embodiment

Figure 11:
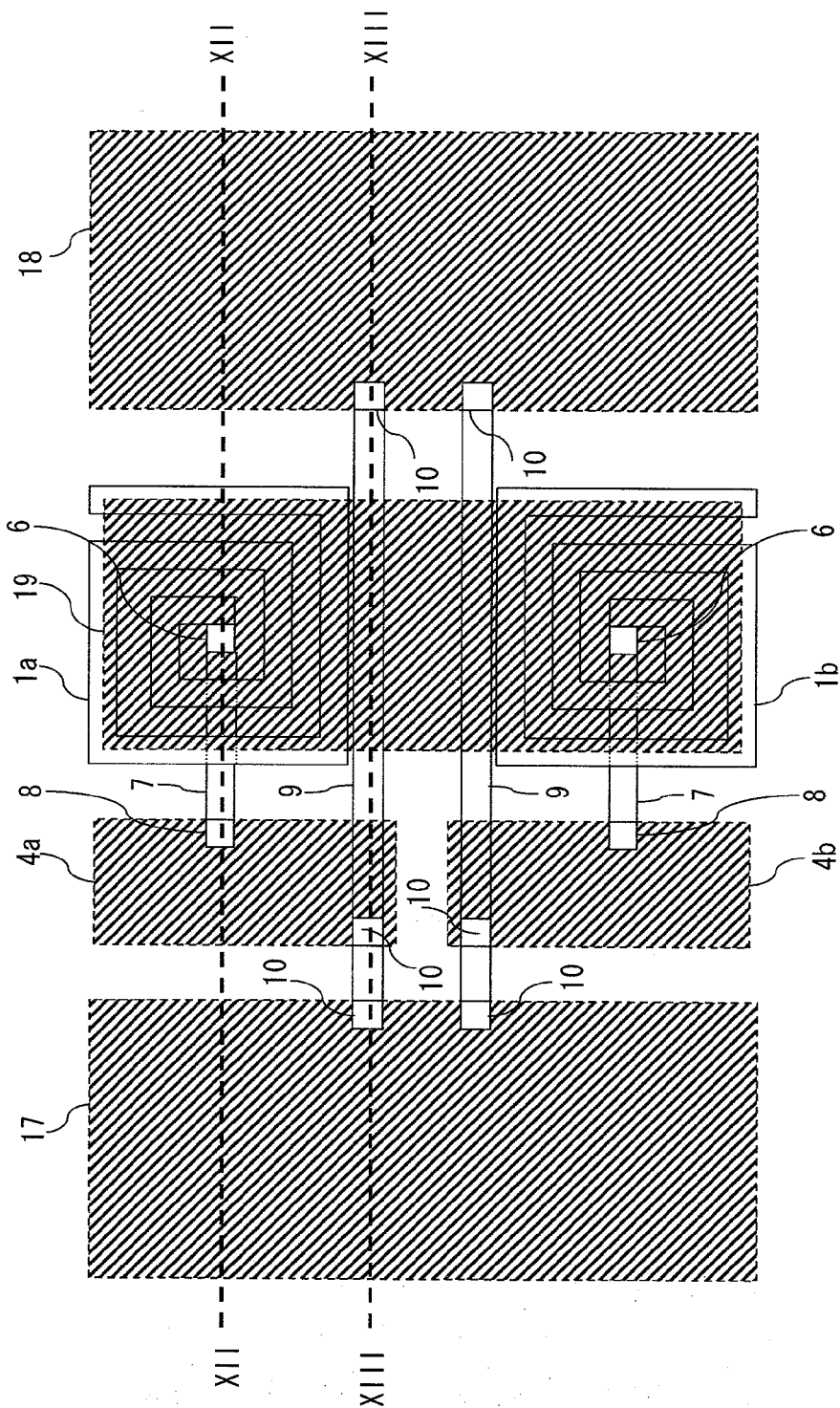
FIG. 11 is a layout plane view schematically showing a semiconductor device in accordance a fourth exemplary embodiment of the present invention.
Figure 12:
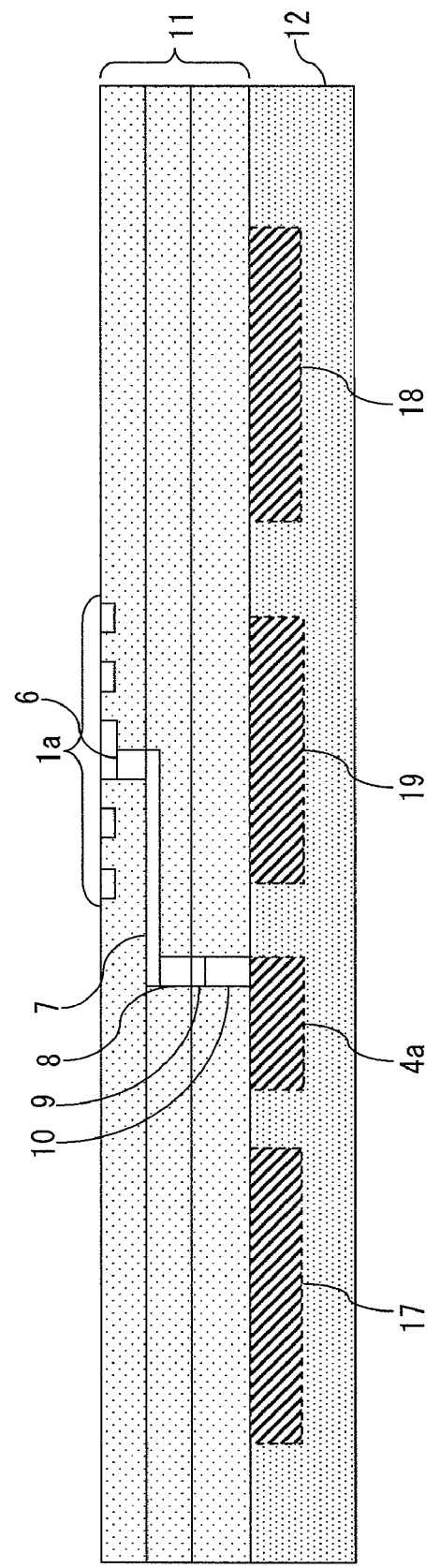
FIG. 12 is a cross section along the line XII-XII of FIG. 11.
Figure 13:
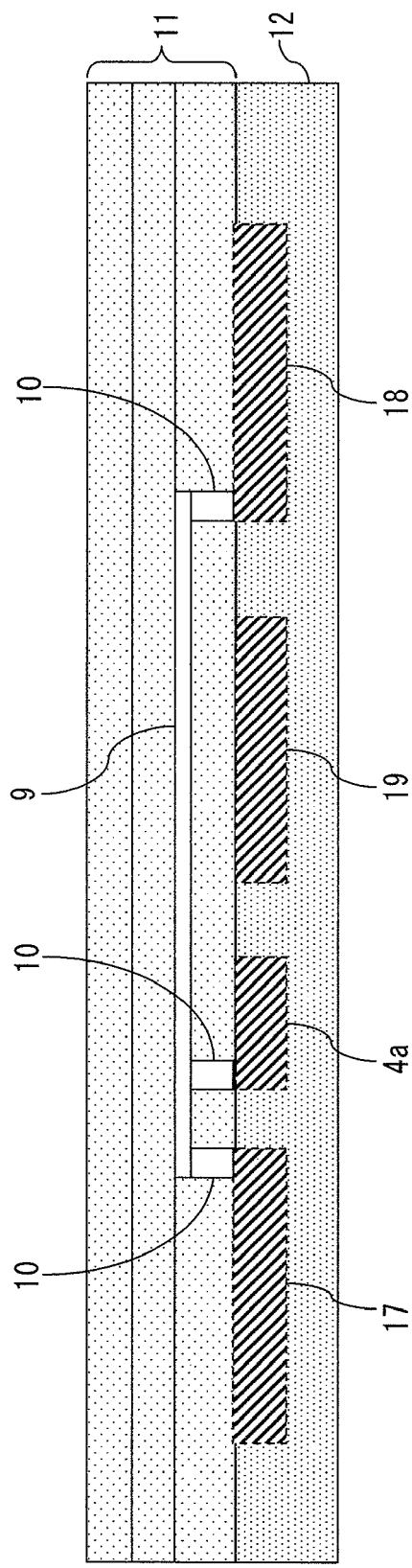
FIG. 13 is a cross section along the line XIII-XIII of FIG. 11.
Figure 14:
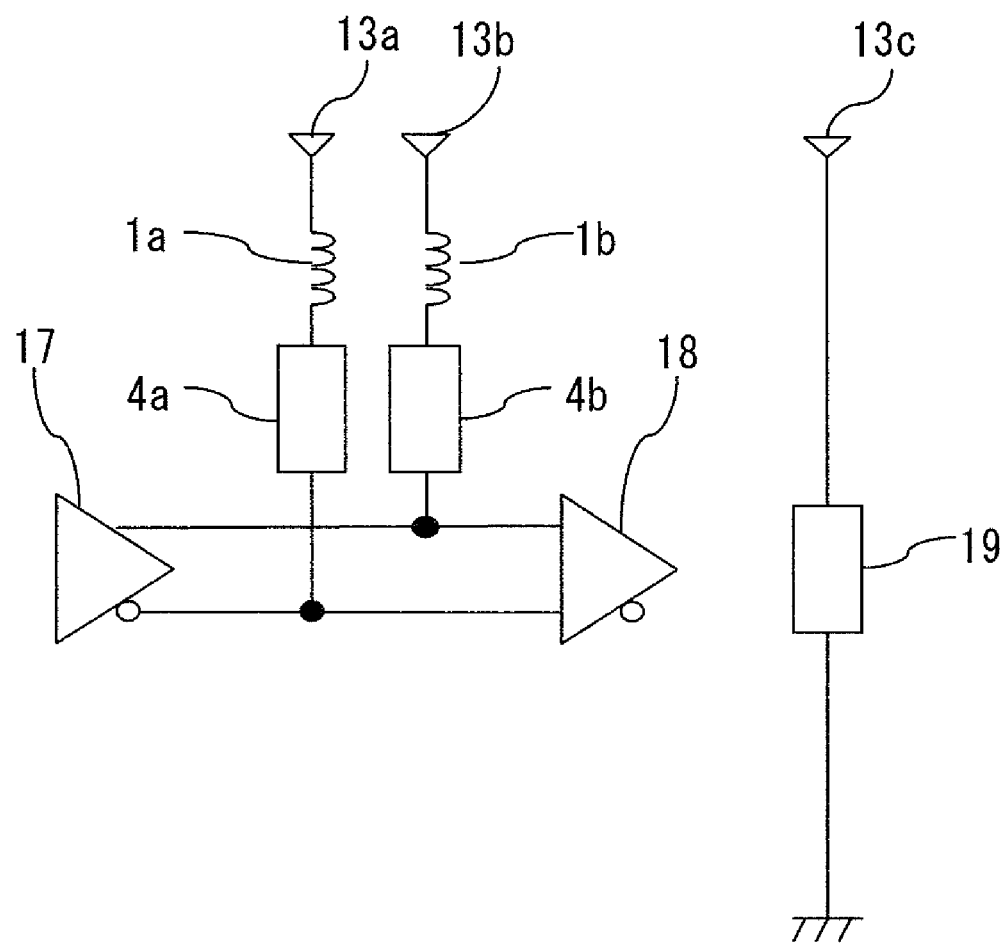
FIG. 14 is a circuit configuration diagram of a semiconductor device in accordance a fourth exemplary embodiment of the present invention.

FIGS. 11 to 14 show a semiconductor device in accordance with a fourth exemplary embodiment of the present invention. FIGS. 11 to 14 show differential buffers of an internal circuit as an example. FIG. 11 is a plane view of a layout, and FIG. 12 is a cross section along the line XII-XII of FIG. 11. Further, FIG. 13 is a cross section along the line XIII-XIII of FIG. 11, and FIG. 14 is a circuit diagram corresponding to the layout of FIGS. 11 to 13.

In FIG. 14, a first inductor 1a, a second inductor 1b, a first terminator 4a, a second terminator 4b, first power supplies 13a, 13b and 13c, an internal buffer 17, a next-stage buffer 18, and an ESD element 19 between power supplies (hereinafter called "inter-power-supply ESD element") are shown. Note that the first power supplies 13a, 13b and 13c are used to supply a first voltage, and may be mutually independent lines or mutually connected lines. Further, a GND, which is a second power supply, is used to supply a second voltage, may also be mutually independent lines or mutually connected lines.

One terminal of the first inductor 1a is electrically connected to the first terminator 4a. The other terminal of the first inductor 1a is electrically connected to the first power supply 13a. The other terminal of the first terminator 4a is electrically connected to the negative-side output terminal of the internal buffer 17 and the input terminal of the next-stage buffer 18. One terminal of the second inductor 1b is electrically connected to the second terminator 4b. The other terminal of the second inductor 1b is electrically connected to the first power supply 13b. The other terminal of the second terminator 4b is electrically connected to the positive-side output terminal of the internal buffer 17 and the input terminal of the next-stage buffer 18. One terminal of the inter-power-supply ESD element 19 is electrically connected to the first power supply 13c. The other terminal of the inter-power-supply ESD element 19 is electrically connected to the GND.

In FIGS. 11 to 13, a first inductor 1a, a second inductor 1b, a first terminator 4a, a second terminator 4b, a second-layer via 6, a second-layer line 7, a first-layer via 8, a first-layer line 9, a contact 10, a wiring layer 11, a semiconductor substrate 12, an internal buffer 17, a next-stage buffer 18, and an inter-power-supply ESD element 19 are shown. The first inductor 1a and the second inductor 1b are formed in the wiring layer 11. The first terminator 4a, the second terminator 4b, the internal buffer 17, the next-stage buffer 18, and the inter-power-supply ESD element 19 are formed in the semiconductor substrate 12. The first inductor 1a is formed by a line in the uppermost layer. One terminal of the first inductor 1a is electrically connected to the first terminator 4a through the second-layer via 6, the second-layer line 7, the first-layer via 8, the first-layer line 9, and the contact 10. The other terminal of the first terminator 4a is electrically connected to the internal buffer 17 and the next-stage buffer 18 through the first-layer line 9 and the contact 10. The second inductor 1b is formed by a line in the uppermost layer. One terminal of the first inductor 1b is electrically connected to the second terminator 4b through the second-layer via 6, the second-layer line 7, the first-layer via 8, the first-layer line 9, and the contact 10. The other terminal of the second terminator 4b is electrically connected to the internal buffer 17 and the next-stage buffer 18 through the first-layer line 9 and the contact 10. In FIGS. 11 to 13, the first inductor 1a and the second inductor 1b are formed above the inter-power-supply ESD element 19 such that they are disposed over the inter-power-supply ESD element.

Although it is uncommon, in an internal circuit, to add an ESD element having a large layout size at the output end of a buffer as shown in first to third exemplary embodiments, the inter-power-supply ESD element is indispensable. Further, an inductor is sometimes used even in an internal circuit in order to widen the frequency band. The fourth exemplary embodiment is an embodiment in which the increase in the layout side is suppressed by forming an inductor(s) and an inter-power-supply ESD element such that they vertically overlap each other in an internal circuit. While the invention has been described in terms of several exemplary embodiments, those skilled in the art will recognize that the invention can be practiced with various modifications within the spirit and scope of the appended claims and the invention is not limited to the examples described above. Further, the scope of the claims is not limited by the exemplary embodiments described above. Furthermore, it is noted that, Applicant's intent is to encompass equivalents of all claim elements, even if amended later during prosecution.

What is claimed is:

1. A semiconductor device comprising an electrostatic discharge element that protects the semiconductor device from electrostatic destruction, the semiconductor further comprising:
    a first circuit;
    a second circuit;
    a third circuit configured for connection to a first power supply;
    a first connection node connecting the first circuit to the second circuit and the third circuit; and
    a first inductor connected between the first connection node and the third circuit,
    wherein the first inductor and a first electrostatic discharge element of the electrostatic discharge element are formed so that they vertically overlap each other.

2. The semiconductor device according to claim 1, wherein the first electrostatic discharge element is connected between the first connection node and a second power supply.

3. The semiconductor device according to claim 1, wherein the first inductor is formed above the first electrostatic discharge element.

4. The semiconductor device according to claim 1, wherein a resistance is connected in series with the first inductor between the first connection node and the first power supply.

5. The semiconductor device according to claim 1, wherein a second inductor is connected between a connection point between the first connection node and the first inductor and the second circuit, and
    the first inductor and the second inductor form a coupled inductor.

6. The semiconductor device according to claim 1, wherein a third inductor is connected between a connection point between a second connection node and the first power supply.

7. The semiconductor device according to claim 1, wherein a fourth inductor is connected between a connection point between a second connection node and a fourth circuit which includes a second output terminal.

8. The semiconductor device according to claim 1, further comprising:
    a second electrostatic discharge element of the electrostatic discharge element.

9. The semiconductor device according to claim 1, wherein the first circuit includes an output buffer.

10. The semiconductor device according to claim 1, wherein the third circuit includes the first power supply and a terminator.

* * * * *